United States Patent [19]
Holm et al.

[11] Patent Number: 4,805,003
[45] Date of Patent: Feb. 14, 1989

[54] GAAS MESFET

[75] Inventors: Paige M. Holm, Tempe; Curtis D. Moyer, Phoenix, both of Ariz.

[73] Assignee: Motorola Inc., Schaumburg, Ill.

[21] Appl. No.: 120,569

[22] Filed: Nov. 10, 1987

[51] Int. Cl.⁴ .................. H01L 29/205; H01L 29/80
[52] U.S. Cl. ........................... 357/22; 357/16; 357/23.4; 357/56
[58] Field of Search ............ 357/22, 23.4, 16, 56

[56] References Cited

U.S. PATENT DOCUMENTS

| | | | |
|---|---|---|---|
| 4,404,575 | 9/1983 | Nishizawa | 357/22 |
| 4,561,168 | 12/1985 | Pitzer et al. | 357/23.4 |
| 4,568,958 | 2/1986 | Baliga | 357/23.4 |
| 4,587,540 | 5/1986 | Jackson | 357/56 |
| 4,624,004 | 11/1986 | Calviello | 357/56 |
| 4,636,823 | 1/1987 | Margalit | 357/23.4 |
| 4,746,960 | 5/1988 | Valeri et al. | 357/23.4 |

FOREIGN PATENT DOCUMENTS

| | | | |
|---|---|---|---|
| 59-41871 | 3/1984 | Japan | 357/22 |
| 59-186371 | 10/1984 | Japan | 357/23.4 |

Primary Examiner—Andrew J. James
Assistant Examiner—Jerome Jackson, Jr.
Attorney, Agent, or Firm—Harry A. Wolin; Joe E. Barbee

[57] ABSTRACT

A vertical III-V compound MESFET is provided. The MESFET has a buried P-type layer which separates the source and the drain regions. A small N-type region in the buried P layer connects the source channel to the drain area. This opening in the buried P layer is located underneath the Schottky gate.

10 Claims, 3 Drawing Sheets

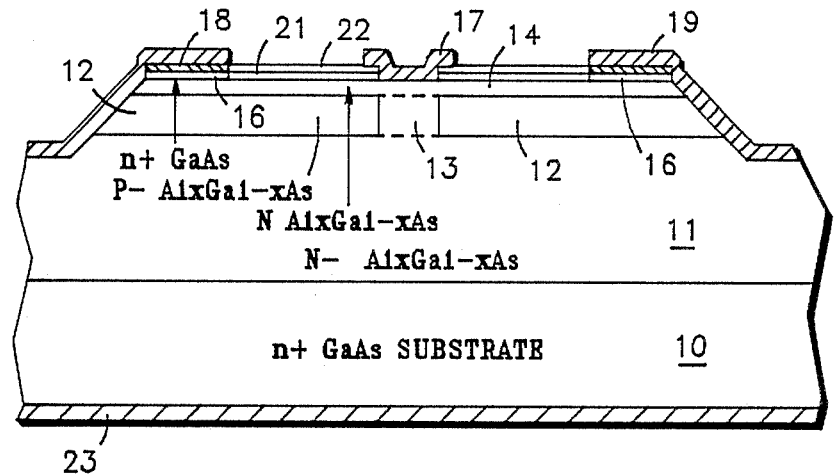
*FIG. 1*
*FIG. 2*
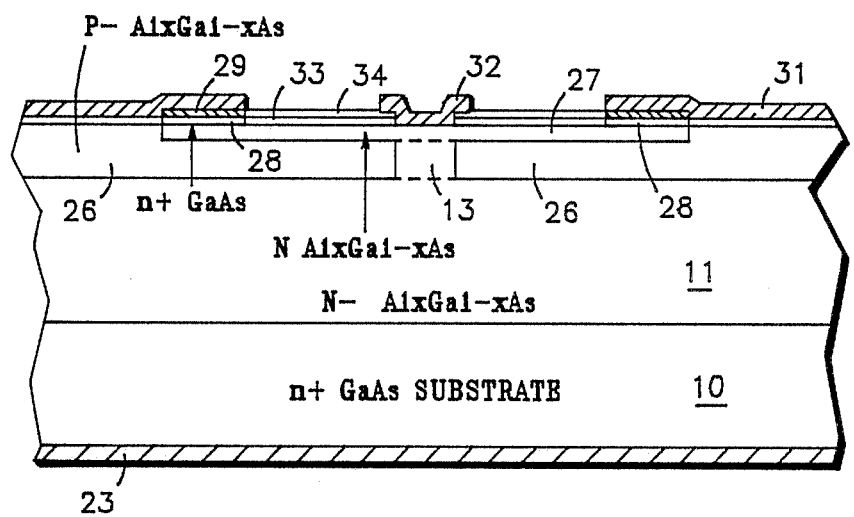

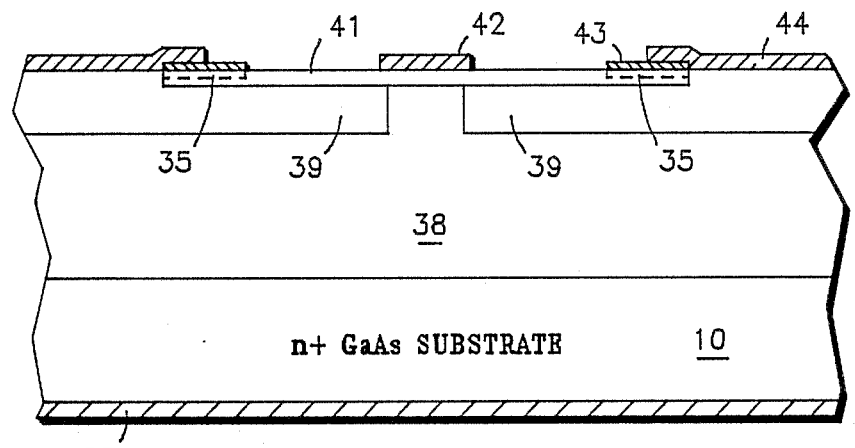
*FIG. 3*
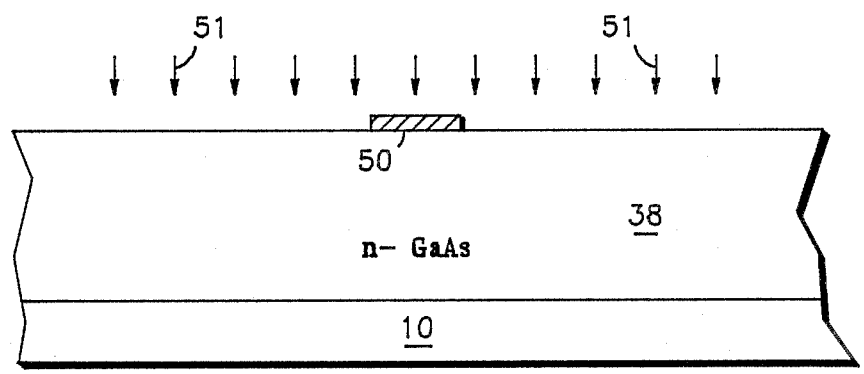
*FIG. 4*
*FIG. 5*
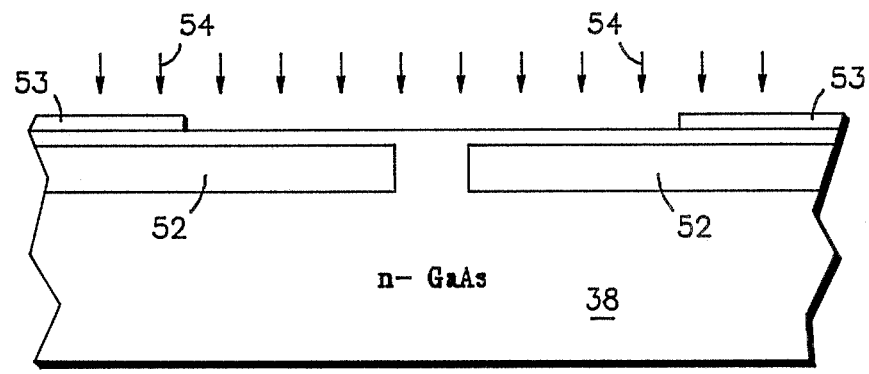

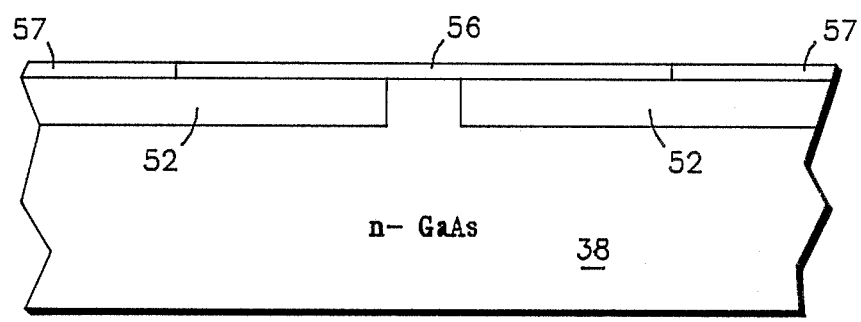
FIG. 6
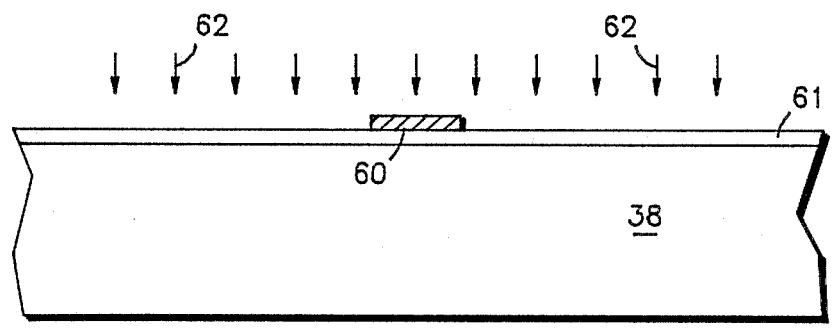
FIG. 7
FIG. 8
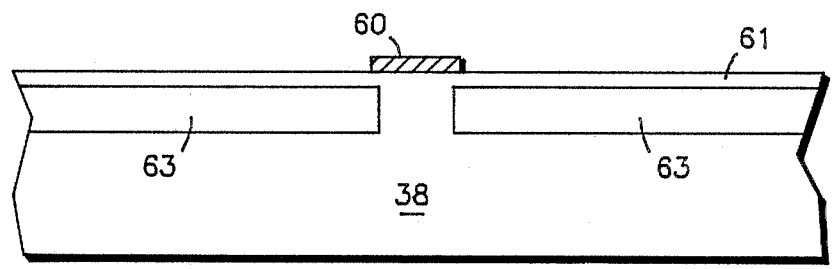

GAAS MESFET

BACKGROUND OF THE INVENTION

This invention relates, in general, to III-V compound semiconductor or field effect transistors, and more particularly, to a III-V compound semiconductor vertical MESFET (Metal Semiconductor Field Effect Transistor).

Silicon power field effect transistors are well known and are capable of handling up to a thousand volts and several amperes. However, the performance of the silicon devices is ultimately limited by the basic properties of the silicon from which these devices are made. It has been shown in the literature that the on-resistance of power field effect transistors is inversely proportional to the carrier mobility and inversely proportional to the cube of the energy band gap. Using this knowledge it has been predicted that the on-resistance of GaAs FETs is at least twelve times lower than that of silicon FETs of equal semiconductor area and breakdown voltage. However, most of the GaAs FETs found in prior patents are actually MISFETs. An example of such a device is disclosed in U.S. Pat. No. 4,568,958 which issued Feb. 4, 1986 to Baliga. A vertical GaAs MESFET is disclosed in U.S. Pat. No. 4,587,540 which issued May 6, 1986 to Jackson. This MESFET has a top side drain on a mesa with gates on either side of the drain and the source located on the bottom.

It is an object of the present invention to provide a vertical III-V compound semiconductor MESFET having topside source and gate electrodes.

Another object of the present invention is to provide a vertical III-V compound semiconductor MESFET having a low die size yet providing lower device on-resistance, much higher operating frequencies, and higher switching speeds.

A further object of the present invention is to provide a vertical MESFET having a larger bandgap which allows higher doping thereby resulting in lower onresistance.

SUMMARY OF THE INVENTION

The above and other objects and advantages of the present invention are achieved by a vertical III-V compound semiconductor MESFET having a top side gate and source. The drain is located on the bottom side of the substrate. A buried layer is provided near the top side having an opening therein. The opening is to provide a path for current flow between the drain and the source. The buried layer effectively isolates the drain and source regions except for the opening which is positioned below the gate.

BRIEF DESCRIPTION OF THE DRAWINGS

FIG. 1 illustrates, in skeleton form, a cross-section of one embodiment of a device of the present invention;

FIG. 2 is a cross-sectional view of another embodiment of the present invention;

FIG. 3 is a cross-sectional view of yet another embodiment of the present invention;

FIGS. 4, 5, and 6 illustrate some process steps in fabricating the device of FIG. 3; and FIG. 7 and 8 illustrate alternate process steps for fabricating the device of FIG. 3.

DETAILED DESCRIPTION OF THE DRAWINGS

FIG. 1 illustrates, in skeleton form, a crosssectional view of a vertical III-V compound semiconductor FET. For ease in explaining the embodiments of the present invention, specific III-V compounds will be used merely as an example and not to infer a limitation to these embodiments. This FET has a heavily doped GaAs substrate 10 covered by a thick, lightly doped epitaxial layer 11. In a preferred embodiment, substrate 10 and epitaxial layer 11 are both N-type conductivity. Epitaxial layer 11 can be any III-V compound such as $Al_xGa_{1-x}As$. A GaAs power FET device will have a lower on-resistance than will a silicon power FET device for a given semiconductor area and breakdown voltage. Theoretically the on-resistance can be decreased 20 percent further by using the ternary $Al_xGa_{1-x}As$ with x being approximately 0.3, because the bandgap increases without sacrificing significant mobility until the material goes indirect. A P-type layer 12 is put on top of layer 11. P-type layer 12 is $Al_xGa_{1-x}As$. Layer 12 is covered by an N-type layer 14. Layer 14 is $Al_xGa_{1-x}As$. A deep silicon implant is used to convert a portion of buried P layer 12 into an N region 13. In this embodiment, gate 17 is self-aligned to this implant with processing involving two dielectric layers 21 and 22. Dielectric layer 21 can be $Si_3N_4$ and dielectric layer 22 can be $SiO_2$. A heavily doped N-type GaAs cap layer 16 can be used if the mole fraction x in the $Al_xGa_{1-x}As$ is sufficiently high to make ohmic contact to channel layer 14 difficult. Cap layer 16 is covered by source ohmic metal 18.

The metal layer used to form gate 17 is also patterned to form metal line 19 which contacts ohmic metal 18. Since this FET is illustrated as being an etched mesa device, metal 19 also contacts channel layer 14, P layer 12, and epi layer 11. This provides a Schottky contact to layer 11 thereby placing a Schottky diode between the source and drain which is advantageous in many applications. Metal layer 19 also provides a contact to P layer 12 clamping it to within the contact barrier height of the source potential and thus preventing turn-on of the parasitic NPN transistor. The conductivity of P layer 12 must be sufficiently high to prevent the parasitic NPN turn-on under practical $dv_d/dt$ conditions. P layer 12 doping is limited to what can be compensated by implantation without having the implant tails significantly affect the concentration of the N-type layers on either side. The thickness of buried layer 12 is limited by the depth of the masked silicon implantation and the ability to achieve a relatively flat doping profile.

In a preferred embodiment, source 19 surrounds and encloses gate 17, and drain metal 23 is attached to the bottom side of substrate 10. A typical dopant concentration for substrate 10 and cap area 16 is a dopant in the range of 1 to $5 \times 10^{18}$ atoms per cubic centimeter. The thickness of cap layer 18 is in the range from 0.1 to 0.2 microns; however, it will be noted that this thickness is not critical. The dopant concentration of N-type channel layer 14 is in the range of 1 to 3 times $10^{17}$ atoms per cubic centimeter. A typical thickness for channel layer 14 is in the order of 0.15 to 0.20 microns. N-type layer 11 can have a dopant concentration of $1 \times 10^{15}$ atoms per cubic centimeter and a thickness of 25 to 30 microns both of which are a function of desired breakdown voltage. P-type layer 12 can have a dopant concentration in the range of 1 to $3 \times 10^{17}$ atoms per cubic centrimeter and a thickness of 0.5 to 1.0 microns. The width of opening 13 can be in the range of 2 to 3 microns. The distance between the edge of opening 13 and the edge of source ohmic metal 18 can be two microns. Source ohmic metal 18 can be in the range of 2 to 5 microns wide although this dimension is not too critical.

AlGaAs is preferred in this embodiment because this material gives the freedom to tailor both bandgap and doping to obtain optimum profiles. Although in many ways the FET illustrated in FIG. 1 resembles a DMOS FET it is a depletion mode rather than an enhancement mode device. Vertical structures in general provide larger breakdown voltages than lateral structures and also achieve reduced resistance due to current spreading through the substrate. Still, due to the wide depletion width required for high voltages, the resistance is dominated by the drift region component.

FIG. 2 illustrates a III-V compound vertical power FET very similar to the one illustrated in FIG. 1 except that it has a planar configuration as opposed to the mesa etched configuration. Substrate 10 and layer 11 are the same as in the previous device as far as dopant concentration and thicknesses are concerned. On the bottom side of substrate 10 is drain metal 23. P layer 26 is placed on epitaxial layer 11 and is covered by N layer 27. Also shown is an N-type cap layer 28. Layers 26, 27, and 28 all have the same thickness and dopant concentrations as the corresponding layers in FIG. 1. A deep silicon implant is used to convert a portion of P layer 26 into an N region 13. Gate 32 is self-aligned to the deep silicon implant with processing involving two dielectric layers 33 and 34. Dielectric layer 33 is silicon nitride while dielectric layer 34 is silicon dioxide. Source ohmic metal 29 contacts cap layer 28. Metal layer 31 contacts source ohmic metal 29. A shallow P+ diffusion using zinc as a dopant or a P+ implant using beryllium as a dopant is used to convert a portion of layers 28 and 27 to contact the underlying P layer 26. No mesa etching is required thus making the device planar. Even with gate metal the high doping concentration of the P+ diffusion should provide low resistance contacts to the converted N-type cap 28. The larger contact area to P layer 26 also reduces the contact resistance. A P-N junction diode now replaces the Schottky diode between source and drain. This device should have nearly identical performance to the device of FIG. 1 and will provide greater immunity to the breakdown of the parasitic NPN transistor under $dv_d/dt$ conditions. Also, elimination of the wet chemical etching of the mesas simplifies processing and the planar surface is always beneficial in fabrication.

The Schottky gate metal can be made with any suitable metal or alloy such as titanium, platinum, and gold. The drain and source ohmic metals can be made from any suitable metals or alloys such as nickel, germanium, and gold.

FIG. 3 illustrates yet another embodiment of the present invention. Substrate 10 is a highly doped N-type GaAs substrate as in the other embodiments. The bottom side of substrate 10 has drain metal 23. The top side of substrate 10 is covered by lightly doped N-type epitaxial layer 38. In a preferred embodiment, layer 38 is N-type GaAs. A buried P layer 39 is formed in layer 38. This is covered by an N-type GaAs layer 41. Buried P layer 39 can be formed by a deep, selective, acceptor implant such as beryllium, magnesium, zinc, or the like. The gate region and areas outside of the device active region are masked (unimplanted) during this step. The implant mask is then removed and the entire region between the source contacts receives a shallow donor silicon channel implant. A further masked N+ implant may be used to provide source contact enhancement region 35. These implants may be annealed simultaneously. Gate metal 42 is formed over an opening in P layer 39. Source ohmic metal 43 is positioned just above N+ implant region 35. The N-type material of layer 41 just outside of the source regions is made P-type such as by zinc diffusion to provide contact from metal layer 44 to P layer 39. Metal layer 44 also contacts source ohmic metal 43. Gate metal 42 sits directly on top of N-type layer 41 and is called a Schottky gate.

The vertical III-V compound MESFET of FIG. 3 uses selective P-type implantation. This device is believed to have distinct advantages over the devices of FIGS. 1 and 2 in that the resulting device has no conduction band barriers to impede current flow or to add resistance. In addition, the epitaxial requirements are minimal, and the fabrication of the device lends itself to a very simple self-aligned process. This device does not require a mesa etched step. By using acceptor implanation such as beryllium, the P layer 39 doping concentration is sufficiently low that acceptor outdiffusion towards the surface during anneal should be negligible. P layer 39 has a doping concentration of approximately $1 \times 10^{17}$ atoms per cubic centimeter. Furthermore, the conducting path of the device of FIG. 3 is free of any converted material or perturbations in the conduction band which could impede current flow and increase resistance.

FIG. 4 illustrates in skeleton form the P-type implant. Substrate 10 is covered by epitaxial layer 38. An implant mask 50 is positioned in a predetermined location on a portion of epitaxial layer 38. A dopant is implanted into epitaxial layer 38. The dopant is illustrated by arrows 51. The dopant can be any suitable acceptor implant dopant such as beryllium, magnesium, zinc, or the like.

FIG. 5 is a continuation of the process of FIG. 4. In FIG. 5 implant mask 50 has been removed and an implant mask 53 has been applied. A shallow, donor channel implant is then provided. This donor implant can be silicon and is illustrated by arrows 54. The implants can then be annealed simultaneously. This will provide buried P layer 52 and a channel region above it.

FIG. 6 is a continuation of the process illustrated in FIG. 5. FIG. 6 illustrates buried P layer 52 and epitaxial layer 38 with an N-type channel 56 above buried P layer 52 and straddling the opening in P layer 52. Also illustrated are the lightly doped areas 57 surrounding channel layer 56. Lightly doped areas 57 result from the use of implant mask 53 (shown in FIG. 5).

FIGS. 7 and 8 illustrate an alternate process to that illustrated in FIGS. 4, 5, and 6 to provide the III-V compound vertical MESFET illustrated in FIG. 3. FIG. 7 illustrates thick N-type epitaxial layer 38 covered by thin N-type epitaxial layer 61. The dopant concentration of layer 61 is higher than the dopant concentration in layer 38. Layer 61 forms the channel region for the resulting device whereas thick epitaxial layer 38 forms a portion of the drain region. A refractory metal implant mask 60 is positioned over a portion of layer 61. Acceptor ions, represented by arrows 62, are then implanted into epitaxial layer 38. Mask 60 prevents the ions from reaching an area directly beneath the mask. Since mask 60 is a refractory metal it can also serve as a Schottky gate metal for the resulting device.

FIG. 8 shows buried P layer 63 after annealing of the acceptor ions. Note the lateral straggle of the P implant. This is illustrated by the extension of buried P layer 63 underneath refractory metal gate 60. The selfaligned process illustrated in FIGS. 7 and 8 eliminates several process steps by using the gate metal as a selfaligned implant mask.

The doping and thickness of the N-type layer underneath the Schottky gate determines whether the resulting vertical MESFET will be an enhancement or depletion mode device and the magnitude of the turn-on or pinch off voltage respectively. Lower doping tends toward enhancement mode devices with increasing turn-on voltage, while heavier doping moves towards depletion mode, higher pinch off voltage devices. With the tight tolerance in layer doping and thickness of present epitaxial and implant technologies and gate recessing techniques the pinch off or turn-on voltage may be readily tailored to the desired values. It is preferred that the gate metal be a refractory metal or equivalent in order to stand up to the high temperature anneal required to activate the implanted acceptors and return the N layer to its original conductivity. The straggle of the buried layer in the lateral direction results in a neck length smaller than the gate length such that pinch off occurs on the top side of the P layer.

By now it should be appreciated that there has been provided a novel vertical III-V compound MESFET. This MESFET can be employed in a concentric gate-source configuration and a multi-cell format. The illustrated device is a depletion mode device and pinch off occurs between the fringing space charge region of the gate and the upper two corners of the buried P layer. As positive voltage is increased on the drain, the space charge region from the buried P layer wraps around the compensated region and continues to extend toward the drain. This effect shields the heavily doped material under the gate with an expanding depletion layer which greatly increases the breakdown voltage capability.

We claim:

1. A vertical III-V compound device having IIIV compound semiconductor substrate of a first conductivity; a first layer on the substrate of the first conductivity; a buried layer of a second conductivity having an opening therein and the opening being of the first conductivity; a second layer of the first conductivity covering the buried layer and the opening; and a metal Schottky gate electrode positioned on the second layer over the opening in the buried layer.

2. The vertical III-V compound device of claim 1 wherein the first layer is N-type AlGaAs, the buried layer is P-type AlGaAs, and the second layer is N-type AlGaAs.

3. The vertical III-V compound device of claim 1 wherein the first layer is N-type GaAs, the buried layer is P-type GaAs, and the second layer is N-type GaAs.

4. The vertical III-V compound device of claim 1 further including a source electrode on the second layer and surrounding the gate electrode, and a drain electrode on the substrate opposite to the side of the first layer.

5. A vertical GaAs FET comprising: a GaAs substrate; a first layer covering the GaAs substrate, the first layer being of AlGaAs and of a first type conductivity; a second layer covering the first layer and being of AlGaAs and of a second type conductivity; a third layer located on the second layer and being of the first type conductivity; a source electrode for conducting current from the third layer; a gate electrode positioned on the third layer for controlling the current; a drain electrode positioned on the substrate opposite from the first layer; and an area in the second layer positioned beneath the gate electrode doped to be of the first type conductivity to provide a current path from the drain electrode to the source electrode wherein the third layer covers the second layer and the area.

6. The vertical GaAs FET of claim 5 wherein the substrate is doped N-type conductivity, the first layer is doped N-type conductivity and at a lesser dopant density than the substrate, the second layer is doped P-type conductivity and makes contact with the source electrode, the third layer is doped N-type, and the area in the second layer positioned beneath the gate electrode is doped N-type.

7. The vertical GaAs FET of claim 5 wherein the area in the second layer positioned beneath the gate electrode is doped with silicon to provide an implant compensated area.

8. The vertical GaAs FET of claim 5 further having a highly doped region underneath the source electrode to enhance conductive contact to the third layer.

9. A vertical GaAs FET comprising: an N-type conductivity GaAs substrate; a first layer covering the substrate and being N-type conductivity AlGaAs and being lighter doped than the substrate; a second layer over the first layer and being P-type conductivity AlGaAs; a third layer over the second layer and being N-type conductivity AlGaAs and being doped to a level between the dopant level of the substrate and the first layer; the third layer leaving a portion of the second layer exposed; a layer of metal over the third layer and being patterned to form gate metal and source metal wherein the source metal makes contact with the exposed portion of the second layer, and the second layer having an opening located below the gate metal to provide a conductive path between the third and first layers wherein the third layer covers the second layer and the opening; and a layer of metal on the side of the substrate opposite from the first layer.

10. The vertical GaAs FET of claim 9 wherein the gate metal comprises titanium, platinum, and gold; and wherein the layer of metal on the substrate forms the drain electrode and comprises nickel, germanium, and gold.

* * * * *